United States Patent
Chung et al.

(10) Patent No.: US 12,005,612 B2
(45) Date of Patent: Jun. 11, 2024

(54) TRANSPARENT STRETCHABLE SUBSTRATE AND MANUFACTURING METHOD THEREOF

(71) Applicant: Korea Institute of Science and Technology, Seoul (KR)

(72) Inventors: Seungjun Chung, Seoul (KR); Phillip Lee, Seoul (KR); Seung Hyun Lee, Seoul (KR); Seong Kwon Hwang, Seoul (KR); Hyunjoo Cho, Seoul (KR); Jeong Gon Son, Seoul (KR); Jai Kyeong Kim, Seoul (KR); Heesuk Kim, Seoul (KR); Sang-Soo Lee, Seoul (KR); Tae Ann Kim, Seoul (KR); Jong Hyuk Park, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 17/177,856

(22) Filed: Feb. 17, 2021

(65) Prior Publication Data

US 2022/0161462 A1    May 26, 2022

(30) Foreign Application Priority Data

Nov. 25, 2020 (KR) .......... 10-2020-0160365

(51) Int. Cl.
*B29C 35/02* (2006.01)
*B29C 35/00* (2006.01)
(Continued)

(52) U.S. Cl.
CPC ............ *B29C 35/02* (2013.01); *B29C 35/002* (2013.01); *B32B 7/022* (2019.01); *B32B 37/144* (2013.01);
(Continued)

(58) Field of Classification Search
CPC ....... B29C 35/02; B29C 35/002; B32B 7/022; B32B 37/144; B32B 38/08; B32B 38/145;
(Continued)

(56) References Cited

U.S. PATENT DOCUMENTS

| | | | | |
|---|---|---|---|---|
| 2013/0271828 A1* | 10/2013 | Everaerts | ............ | B32B 37/1292 156/60 |
| 2015/0189741 A1* | 7/2015 | Hong | ................... | H05K 1/0283 427/372.2 |
| 2016/0104850 A1* | 4/2016 | Joo | ........................ | B32B 27/283 428/116 |

FOREIGN PATENT DOCUMENTS

| KR | 10-2015-0077899 A | 7/2015 |
|---|---|---|
| KR | 10-2016-0042288 A | 4/2016 |

(Continued)

OTHER PUBLICATIONS

Seghir et al., "Extended PDMS Stiffness Range for Flexible Systems", Sensors and Actuators A: Physical, Elsevier, 230, pp. 33-39, Feb. 2015. (Year: 2015).*

(Continued)

*Primary Examiner* — Christopher W Raimund
(74) *Attorney, Agent, or Firm* — Studebaker & Brackett PC

(57) ABSTRACT

Disclosed is a method of manufacturing a transparent stretchable substrate according to various embodiments of the present disclosure. The method may include generating a substrate part formed of an elastic material, generating an auxetic including a plurality of unit structures on the substrate part, and generating a fixing part on the substrate part on which the auxetic is generated.

8 Claims, 6 Drawing Sheets

(51) Int. Cl.
   *B32B 7/022*   (2019.01)
   *B32B 37/14*   (2006.01)
   *B32B 38/00*   (2006.01)
   *B32B 38/08*   (2006.01)
   *H05K 1/02*   (2006.01)
   *H05K 1/03*   (2006.01)

(52) U.S. Cl.
   CPC ............ *B32B 38/08* (2013.01); *B32B 38/145* (2013.01); *H05K 1/0283* (2013.01); *H05K 1/03* (2013.01); *B29K 2995/0094* (2013.01); *B32B 2038/0076* (2013.01); *B32B 2307/51* (2013.01); *B32B 2319/00* (2013.01)

(58) Field of Classification Search
   CPC ........ B32B 2038/0076; B32B 2307/51; B32B 2319/00; H05K 1/0283; H05K 1/03; H05K 2201/09681; H05K 1/0393; H05K 2201/0108; B29K 2995/0094; Y02P 70/50; G09F 9/301
   See application file for complete search history.

(56) References Cited

FOREIGN PATENT DOCUMENTS

| KR | 10-2020-0082370 A | | 7/2020 |
| KR | 1020200082370 A | * | 7/2020 |

OTHER PUBLICATIONS

Novak et al., "Auxetic Cellular Materials—a Review", J. Mech. Eng., vol. 62, No. 9, pp. 485-493, Sep. 2016, https://www.sv-jme.eu/article/auxetic-cellular-materials-a-review/. (Year: 2016).*

Mohamed et al., "Mechanical Properties of Graded Polydimethylsiloxane for Flexible Electronics", J. Phys: Conf. Series, vol. 1150, Mar. 2019, https://iopscience.iop.org/article/10.1088/1742-6596/1150/1/012030. (Year: 2019).*

* cited by examiner

TRANSPARENT STRETCHABLE SUBSTRATE AND MANUFACTURING METHOD THEREOF

CROSS-REFERENCE TO RELATED APPLICATION

This application claims priority to and the benefit of Korean Patent Application No. 10-2020-0160365, filed on Nov. 25, 2020, the disclosure of which is incorporated herein by reference in its entirety.

BACKGROUND

1. Field of the Invention

The present disclosure relates to a stretchable substrate material, and more particularly, to a stretchable substrate capable of controlling, upon stretching based on one axis, a strain related to another axis by generating an elastic substrate containing a mechanical metamaterial having a negative Poisson ratio, and a manufacturing method thereof.

2. Discussion of Related Art

Recently, research and development have been actively conducted on stretchable electronic devices in which electrodes are formed on a flexible substrate in a direction away from conductive devices in which electrodes are formed on a rigid substrate. A stretchable electronic device, which is an electronic device manufactured on a substrate that can be freely stretched by external stress, is a next-generation electronic device that maintains the electrical/physical properties of the device even when a mechanical deformation or an external force is applied thereto. Such a stretchable electronic device may be applied to flexible devices, wearable devices, or the like, and furthermore, may be used as a sensor, electrode, or the like attached to a display or the human body.

Flexible electronic devices can be most widely used in application fields including stretchable displays, stretchable solar cells, stretchable energy storage/power generation devices, and the like, and show the possibility of a next-generation technology succeeding flexible displays. In addition, flexible electronic devices not only increase the degree of freedom of design due to excellent mechanical variability but also secure mechanical stability against an external force. Thus, the market is expanding to wearable devices, electronic skin, smartphones, medical devices, healthcare monitoring systems, the military defense industry, the aerospace industry, and the like.

As a specific example, the display field is evolving from a fixed flat/curved display to flexible, foldable, and rollable types, which are folded or rolled in one direction, such that the degree of freedom of deformation increases. Recently, as electronic devices have become smart and space mobility is emphasized, there is a need to develop a stretchable display that can be used freely and deformed in multidimensional axis directions under various conditions beyond a fixed display.

As described above, with the development of technology related to the stretchable display field, it is expected that a new digital interface can be implemented beyond conventional methods. However, since stretchable displays do not have a fixed axis or direction of deformation unlike conventional flexible, foldable, and rollable displays, distortion during deformation is emerging as an issue.

Accordingly, it may be necessary to develop a substrate that can be freely deformed without display distortion even under a low stress and a technology for stretchable electrodes with low resistance, high flexibility, and high stability. That is, in related industries, there may be a demand for a stretchable substrate with a stable mechanical strain, reduced distortion, and high transmittance.

SUMMARY OF THE INVENTION

An object to be achieved by the present disclosure is to solve the above-described problems, and the present disclosure is directed to providing a stretchable substrate capable of controlling, when the corresponding substrate is stretched along one axis, a strain related to another axis by generating an elastic substrate containing a mechanical metamaterial with a negative Poisson's ratio, and a manufacturing method thereof.

Objects to be achieved by the present disclosure are not limited to the aforementioned object, and other objects not mentioned herein can be clearly understood by those skilled in the art from the following description.

According to an aspect of the present disclosure, there is disclosed a method of manufacturing a transparent stretchable substrate. The method may include generating a substrate part formed of an elastic material, generating an auxetic including a plurality of unit structures on the substrate part, and generating a fixing part on the substrate part.

In response to an external force generated with respect to one axis, each of the plurality of unit structures may cause deformation of the auxetic with respect to another axis.

The other axis may include at least one of a first axis located perpendicular to the one axis on the same plane and a second axis based on a plane perpendicular to the same plane.

The generating of the auxetic may include performing a printing process utilizing elastic materials.

The generating of the auxetic may include performing first curing and performing second curing, and the performing of the second curing may proceed at a higher temperature than the performing of the first curing.

The generating of the fixing part may include supplying a fixing member in a liquid state to the substrate part coupled to the auxetic and performing third curing.

The substrate part and the auxetic may contain the same elastic material.

The substrate part and the auxetic may further contain a curing agent, a ratio of the curing agent to the elastic material in the substrate part may be a first ratio, a ratio of the curing agent to the elastic material in the auxetic may be a second ratio, and the second ratio may be greater than the first ratio.

The auxetic may include one or more microstructures for controlling a mechanical deformation distribution generated in response to an external force with respect to one axis, and the one or more microstructures may be provided inside each of the plurality of unit structures.

According to another aspect of the present disclosure, there is disclosed a transparent stretchable substrate. The transparent stretchable substrate may include an auxetic including a plurality of unit structures and having a negative Poisson's ratio and a substrate part coupled to the auxetic.

Other specific details of the present disclosure are included in the detailed description and drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
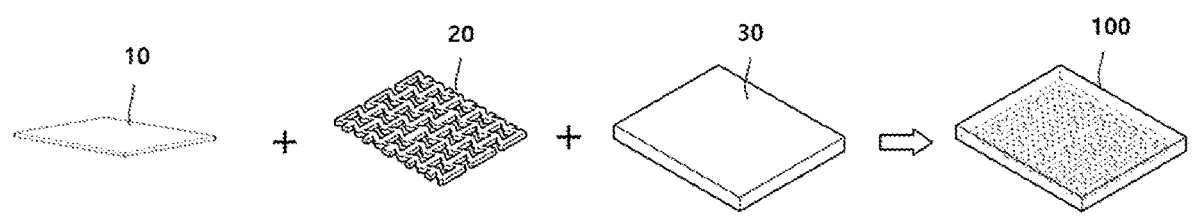
FIG. 1 is a schematic diagram showing a transparent stretchable substrate according to an embodiment of the present disclosure.

Various embodiments and/or aspects will now described with reference to the drawings. In the following description, for purposes of description, numerous specific details are set forth in order to provide a thorough understanding of one or more aspects. However, it is to be understood by those skilled in the art that such aspect(s) may be practiced without these specific details. The following description and the accompanying drawings set forth in detail certain illustrative features of the one or more aspects. These aspects are indicative, however, of but a few of the various ways in which the principles of various aspects may be employed, and this description is intended to include all such aspects and their equivalents. Specifically, as used herein, "embodiment," "example," "aspect," "illustration" and the like may not be construed as having any aspect or design better or more advantageous than other aspects or designs.

Hereinafter, regardless of the reference numerals, the same or similar components are assigned the same reference numerals, and redundant descriptions thereof will be omitted. Moreover, in describing embodiments disclosed herein, the detailed description will be omitted when a specific description for related known technologies is judged to obscure the gist of the embodiments disclosed herein. Also, the accompanying drawings are just for easy understanding of embodiments disclosed herein, and the technical spirit disclosed herein is not limited by the accompanying drawings.

Although the terms first, second, etc. may be used herein to describe various devices or elements, it should be appreciated that these devices or elements are not limited by these terms. These terms are used only to distinguish one device or element from another device or element. Thus, it should be appreciated that a first device or element discussed below could be named a second device or element without departing from the teachings of the present invention.

Unless otherwise defined, all terms (including technical and scientific terms) used herein have the same meanings as understood in common by those skilled in the art. Also, terms defined in commonly-used dictionaries should not be interpreted in an idealized or overly formal sense unless expressly so defined herein.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the term "and/or" used herein should be understood to refer to and include all possible combinations of one or more of the listed related items.

Also, the terms "comprise" and/or "comprising" mean that a corresponding feature and/or element is present but should not be understood as excluding the presence or addition of one or more other features, elements, and/or groups thereof. Also, unless otherwise specified or in cases where it is not clear from the context to designate a singular form, the singular form in the specification and claims should be interpreted as meaning "one or more" in general.

When it is mentioned that a certain element is "coupled to" or "connected to" another element, it should be understood that the certain element may be directly coupled or connected to the other element or still another element may be located therebetween. Conversely, when an element is referred to as being "directly connected" or "directly coupled" to another element, it is to be understood that there are no intervening elements present.

The suffixes "module" and "unit" for elements used in the following description are given or used interchangeably only for ease of writing this specification, and thus do not themselves have distinct meanings or roles.

Also, when it is mentioned that an element or layer is "on" another element or layer, the element or layer may be formed directly on the other element or layer, or a third element or layer may be interposed therebetween. In contrast, when an element is referred to as being "directly on" another element, there are no intervening elements or layers present.

Spatially relative terms, such as "below," "beneath," "lower," "above," and "upper," may be used herein for ease of description to describe the relationship of one element to another element(s) as illustrated in the figures. It is to be understood that the spatially relative terms are intended to encompass different orientations of a device in use or operation, in addition to the orientation depicted in the figures.

For example, an element described as "below" or "beneath" another element could be placed "above" the element if the element shown in the drawing is turned over. Thus, the exemplary term "below" or "beneath" may encompass both orientations of "above" and "below" or "beneath." The element may also be oriented in different directions, and the spatially relative descriptors used herein interpreted accordingly.

Objects and advantages of the present disclosure and technical elements for accomplishing the objects and advantages will be apparent by referring to embodiments described below in detail in connection with the accompanying drawings. In the following description, when the detailed description of the relevant known functions or configurations is determined to unnecessarily obscure the gist of the present invention, the detailed description will be omitted. Also, terms used herein are defined in consideration of functions in the present disclosure and may be changed depending on the intent of an operator, or a custom.

However, the present disclosure is not limited to the following embodiments and may be implemented in various forms. These embodiments are provided only to make the present disclosure complete and to fully inform those skilled in the art of the scope of the disclosure, and the present disclosure is only defined by the scope of the claims. Therefore, the definition should be made based on the contents throughout the specification.

FIG. 1 is a schematic diagram showing a transparent stretchable substrate 100 according to an embodiment of the present disclosure. According to an embodiment of the present disclosure, the transparent stretchable substrate 100 may include a substrate part 10 on which an auxetic 20 is formed. The substrate part 10, which is included in the transparent stretchable substrate 100 and provided to support the auxetic 20 during the process of forming the auxetic 20, may be provided in the shape of a thin film. Also, the substrate part 10 may be made of an elastic material. For example, the substrate part 10 may be made of an elastic material with an elastic modulus equal to or greater than a predetermined reference value, which may be polydimethylsiloxane (PDMS), thermoplastic polyurethane (TPU), VHB, butyl rubber, or the like. The above detailed description of the substrate part is only an example, and the present disclosure is not limited thereto.

The auxetic 20 may be provided on an upper side of the substrate part 10. In the present disclosure, the providing of the auxetic 20 on an upper side of the substrate part 10 may include fixing the auxetic 20 on the upper side of the substrate part 10 after separately manufacturing the substrate part 10 and the auxetic 20 or forming the auxetic 20 on the upper side of the substrate part 10 while forming the substrate part 10. For example, the auxetic 20 may be provided on the upper side of the substrate part 10 by performing a printing process on the upper side of the substrate part 10 through an elastic material in a liquid state and then performing curing through specific curing conditions. The above detailed description of the auxetic provision process is only an example, and the present disclosure is not limited thereto.

Also, the transparent stretchable substrate 100 may include a substrate part 10, an auxetic 20, and a fixing part 30. The transparent stretchable substrate 100 may have a negative Poisson's ratio and may include an auxetic 20 formed through a plurality of unit structures. The auxetic 20 may refer to a mechanical metamaterial having a mechanism for expressing a new mechanical function that did not exist before through the plurality of unit structures. For example, the auxetic 20 which is related to the mechanical metamaterial may have a structure that expands in a vertical direction, which is opposite to that of normal natural stretching. In detail, the auxetic 20 included in the transparent stretchable substrate 100 may include a plurality of unit structures. In this case, each unit structure is provided through one or more shapes, and thus the auxetic 20 may have a negative Poisson's ratio. Poisson's ratio may refer to the ratio of a transverse strain to a longitudinal strain when a tensile force acts on a material to stretch the material in a specific direction. In other words, the Poisson's ratio may refer to a strain between the transverse direction and the longitudinal direction.

Most materials have a positive Poisson's ratio. This is because the tensile direction and the lateral strain of the material have different signs when a tensile force is applied to the material along its short axis. However, when a material is designed to form a specific lattice structure, a negative Poisson's ratio can be achieved macroscopically even if a constituent has a positive Poisson's ratio.

Figure 2:
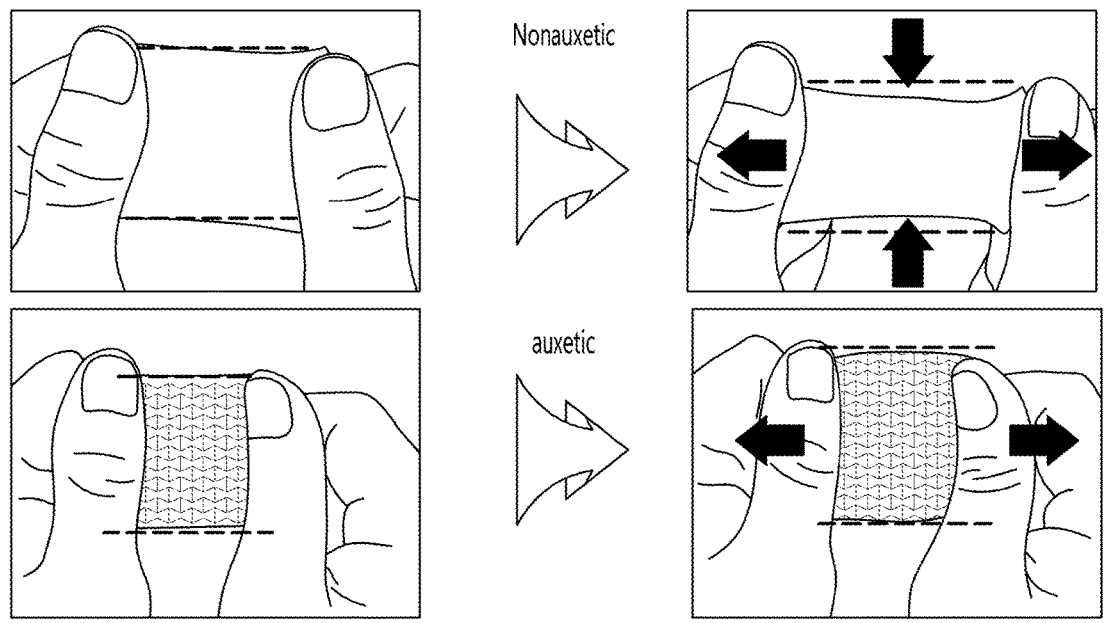
FIG. 2 is an exemplary diagram showing a non-auxetic structure and an auxetic structure according to an embodiment of the present disclosure.

As a specific example, referring to FIG. 2, when a transverse stress is applied to a general non-auxetic material, the material stretches in the corresponding transverse direction and contracts longitudinally. That is, a Poisson's ratio between a longitudinal deformation and a transverse deformation due to a vertical stress in the material may be positive.

On the contrary, when a transverse stress is applied to an auxetic material, the material may be stretched both transversely and longitudinally. That is, a Poisson's ratio due to a vertical stress in the material may be negative.

That is, the auxetic 20 of the present disclosure may refer to a material designed to have a negative Poisson's ratio, i.e., such that the transverse strain and the longitudinal strain have the same sign, unlike general materials. In other words, the transparent stretchable substrate 100 of the present disclosure is formed of an auxetic 20, which is a mechanical metamaterial designed with a specific lattice structure, and thus may control a negative Poisson's ratio or a strain in a direction vertical to the stretching direction. The Poisson's ratio is inherently a material-specific property but can be controlled by forming a specific structure in a material. Representative auxetic structures in which the Poisson's ratio can be controlled to be negative may include, for example, a reentrant structure, a rotating rigid body structure, and a chiral structure. The above detailed description of the auxetic structure is only an example, and the present disclosure is not limited thereto.

Also, the transparent stretchable substrate 100 may include the fixing part 30 to fix the auxetic 20 formed on the upper side of the substrate part 10. The fixing part 30 included in the transparent stretchable substrate 100 may be formed of the same elastic material as the substrate part 10. In detail, when the auxetic 20 is provided (or coupled) on the upper side of the substrate part 10, the transparent stretchable substrate 100 may be generated by supplying an elastic material in a liquid state to the substrate part 10 and the auxetic 20, bringing the elastic material into contact with the substrate part 10 and the auxetic 20 and performing curing through specific curing conditions. That is, the fixing part 30 may be formed on the upper side of the substrate part 10 and the auxetic 20 to fix the auxetic 20 and the substrate part 10 and form the top surface of the transparent stretchable substrate 100.

According to an embodiment, the auxetic 20 may be made of a material with a higher strength than those of the substrate part 10 and the fixing part 30, and thus this may have a great influence on the deformation of the substrate part 10 and the fixing part 30. That is, the transparent stretchable substrate 100 formed through the auxetic 20, the substrate part 10, and the fixing part 30 may be relatively largely affected by the deformation of the auxetic 20 with high strength and thus may have a negative Poisson's ratio. Through the strength of the auxetic, the Poisson's ratio of the substrate according to the present disclosure may be reduced, thus causing an increase in stretchability.

More specific manufacturing methods, structural features, and advantages for the transparent stretchable substrate 100 of the present disclosure will be described below with reference to FIGS. 3 to 8.

Figure 3:
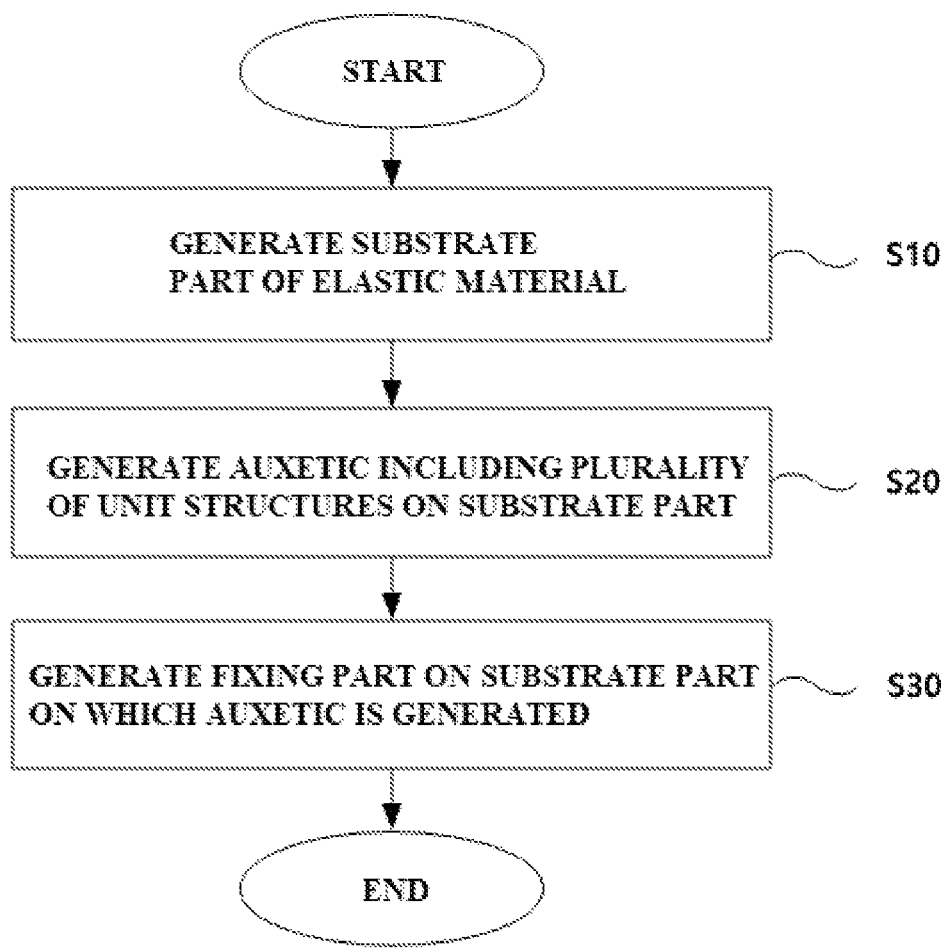
FIG. 3 is a flowchart illustrating a method of manufacturing a transparent stretchable substrate according to an embodiment of the present disclosure.

FIG. 3 is a flowchart illustrating a method of manufacturing a transparent stretchable substrate according to an embodiment of the present disclosure. According to an embodiment, the method of manufacturing the stretchable substrate may include the following operations. The order of the operations illustrated in FIG. 3 may be changed as needed, and at least one operation may be omitted or added. That is, the operations are just examples of the present disclosure, and the scope of the present disclosure is not limited thereto.

According to an embodiment of the present disclosure, the method of manufacturing the transparent stretchable substrate may include generating a substrate part of an elastic material (S10). The substrate part 10, which is provided to support the corresponding auxetic 20 during the process of forming the auxetic 20, may be provided in the shape of a thin film. Also, the substrate part 10 may be made of an elastic material. That is, the substrate part 10 may be utilized as an elastic film for supporting the corresponding auxetic 20 during the process of generating the auxetic 20 to form the lower surface of the transparent stretchable substrate 100.

According to an embodiment of the present disclosure, the method of manufacturing the transparent stretchable substrate may include generating an auxetic including a plurality of unit structures on the substrate part (S20).

In response to an external force generated with respect to one axis, each of the plurality of unit structures may cause the deformation of the auxetic with respect to another axis. Specifically, in order to implement a mechanical metamaterial formed with a negative Poisson's ratio so that the one axis (e.g., a longitudinal axis) and the other axis (e.g., a transverse axis) have the same sign, the auxetic may include the plurality of unit structures. To this end, the plurality of unit structures may be provided through one or more shapes, and the one or more shapes may include, for example, at least one of a reentrant shape, a rotating rigid body shape, and a chiral shape.

That is, since the auxetic 20 includes the plurality of unit structures formed through one or more shapes, the auxetic 20 may cause deformation related to the other direction in response to the external force generated with respect to the one axis. For example, the one axis along which the external force is generated may refer to a transverse axis, and the other axis may refer to a longitudinal axis, which is a direction on the same plane vertical to the axis along which the external force is generated. For example, with respect to a 2D plane, one axis may refer to the x-axis, and the other axis may refer to the y-axis. A detailed exemplary description of the auxetic according to the shape of the plurality of unit structures and a detailed description of the deformation of the auxetic caused in response to an external force generated in one axis will be provided below with reference to FIGS. 4A to 4C.

Figure 4A:
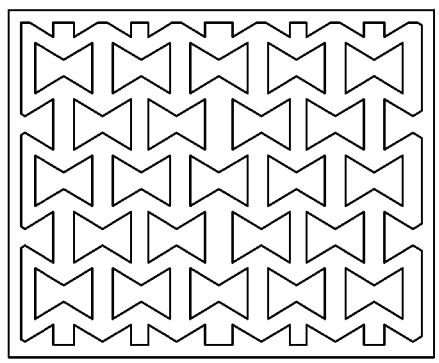
FIGS. 4A to 4C are exemplary diagrams illustrating various shapes of an auxetic according to an embodiment of the present disclosure.

FIG. 4A is an exemplary diagram illustrating an auxetic in which a plurality of unit structures are provided through a reentrant shape. When an external force with respect to the longitudinal direction is applied to the corresponding auxetic, an inner stress acts in the transverse direction of the plurality of unit structures, and thus the corresponding auxetic may have a negative Poisson's ratio. That is, in response to an external force with respect to the longitudinal axis, the auxetic may be stretched with respect to the transverse axis. In other words, through the shape of the plurality of structures provided therein, the auxetic 20 may control a strain generated in the other axis direction when the external force is applied.

Figure 4B:
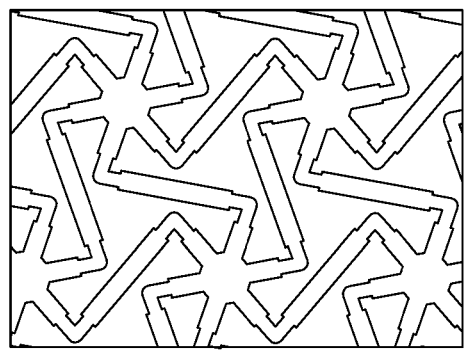

FIG. 4B is an exemplary diagram illustrating an auxetic structure in which a plurality of unit structures are provided through a chiral shape. When an external force with respect to the longitudinal direction is applied to the corresponding auxetic, the plurality of unit structures are rotated in a clockwise or counterclockwise direction, and thus the corresponding auxetic may have a negative Poisson's ratio. That is, through the shape of the plurality of unit structures provided therein, the auxetic 20 may control a strain generated in the other axis direction when the external force is applied. However, the chiral shape corresponding to the plurality of unit structures as shown in FIG. 4B is just an example, and the present disclosure is not limited thereto.

Figure 4C:
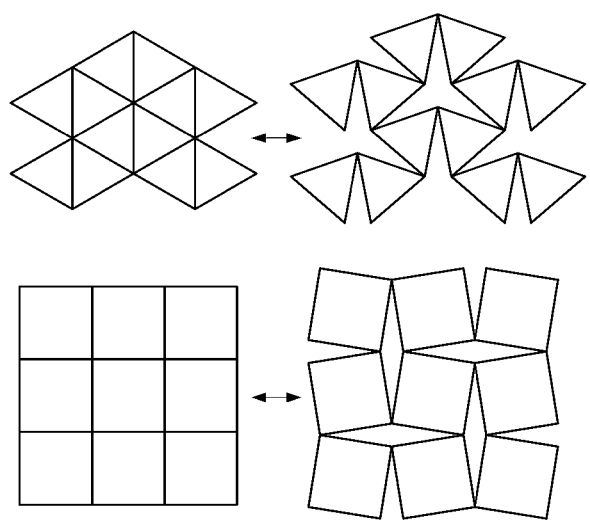

FIG. 4C is an exemplary diagram illustrating an auxetic structure in which a plurality of unit structures are provided through a rotating rigid body shape. Each of the plurality of unit structures may be provided through the rotating rigid body shape related to a triangle or quadrangle, as shown in FIG. 4C. In this case, the plurality of unit structures may share one node, and each unit structure may be rotated around the corresponding node and thus may have the characteristics of an auxetic material. That is, when an external force with respect to the longitudinal direction is applied to the corresponding auxetic, the plurality of unit structures are rotated in a clockwise or counterclockwise direction because a connection line is released with respect to the node shared by the unit structures, and thus the corresponding auxetic may have a negative Poisson's ratio. That is, through the shape of the plurality of structures provided therein, the auxetic 20 may control a strain generated in the other axis direction when the external force is applied. However, the rotating rigid body shape corresponding to the plurality of unit structures as shown in FIG. 4C is just an example, and the present disclosure is not limited thereto.

That is, the transparent stretchable substrate 100 implemented through the auxetic 20 may be a substrate with unique mechanical properties that do not exist in nature by utilizing a new structure. This can present high usability in various fields. For example, the transparent stretchable substrate 100 of the present disclosure may be applied to a flexible device, a wearable device, or the like and utilized to maintain electrical or physical characteristics of the device against external stress. As another example, when the transparent stretchable substrate 100 of the present disclosure is utilized in the display field, the transparent stretchable substrate 100 may support deformation in a multi-dimensional axis direction under various conditions beyond a fixed display that is foldable or rollable in a single direction. This can provide higher variability, thus improving the degree of freedom of design and securing mechanical stability against an external force.

Figure 5:
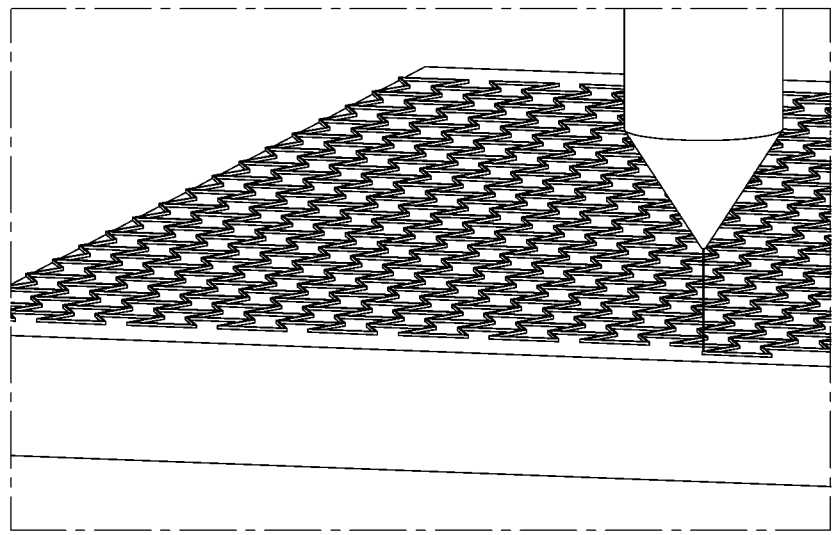
FIG. 5 is an exemplary diagram illustrating a process of manufacturing an auxetic through a printing process according to an embodiment of the present disclosure.

According to an embodiment of the present disclosure, the operation of generating the auxetic may include performing a printing process using an elastic material. In other words, the auxetic 20 may be generated through a printing process using an elastic material. FIG. 5 is an exemplary diagram illustrating a process of manufacturing an auxetic through a printing process according to an embodiment of the present disclosure. Here, the printing process is a process of imprinting a designed circuit pattern on a target object through an inkjet printer, a laminator, or the like and may refer to roll-to-roll processing in which a specific lattice structure (i.e., a plurality of unit structures having a specific shape) is formed (or stacked) through a stretchable or elastic material. Such a printing process may refer to a process using equipment such as an inkjet, a pneumatic dispenser, a screw dispenser, a screen printing device, a bar coater, and a spray printing device. The above detailed description of the equipment used in the printing process is only an example, and the present disclosure is not limited thereto.

That is, the auxetic 20 forming the transparent stretchable substrate 100 of the present disclosure may be generated through the printing process utilizing elastic materials. In other words, the printing process may enable an auxetic corresponding to an interval and size of tens to hundreds of microns to be formed. Thus, it is possible to provide a high degree of freedom of design and a high degree of freedom of material and also provide high efficiency in a large-scale process.

In addition, through the corresponding printing process, the interval or height at which the auxetic 20 is to be inserted may be controlled. Thus, based on a direction of one axis or a direction vertical to the one direction, it is possible to control a strain related to another axis when the transparent stretchable substrate 100 generated through the corresponding process is stretched. That is, the auxetic 20 of the present disclosure may control a strain related to the other axis on the basis of the interval between the plurality of unit structures or the thickness of each of the plurality of unit structures. The interval between the plurality of unit structures may refer to the distance between the unit structures and the size of the unit structures. For example, the interval between the plurality of unit structures being short may mean that the size of the unit structures is relatively small such that the plurality of unit structures are formed at close distances. That is, the interval between the unit structures may be inversely proportional to the number of unit structures included per unit area. In other words, the interval between the unit structures being long may mean that the number of unit structures per unit area is small, and the interval between the unit structures being short may mean that the number of unit structures per unit area is large. Also, the thickness of the plurality of unit structures may the thickness or depth of the unit structures in the transparent stretchable substrate 100.

Specifically, in response to an external force generated with respect to one axis, a strain caused in another axis may be determined. Also, the interval between the plurality of unit structures or the thickness of the plurality of unit structures may be determined based on the determined strain. Also, an auxetic may be generated by performing a printing process corresponding to the interval or thickness.

Figure 6:
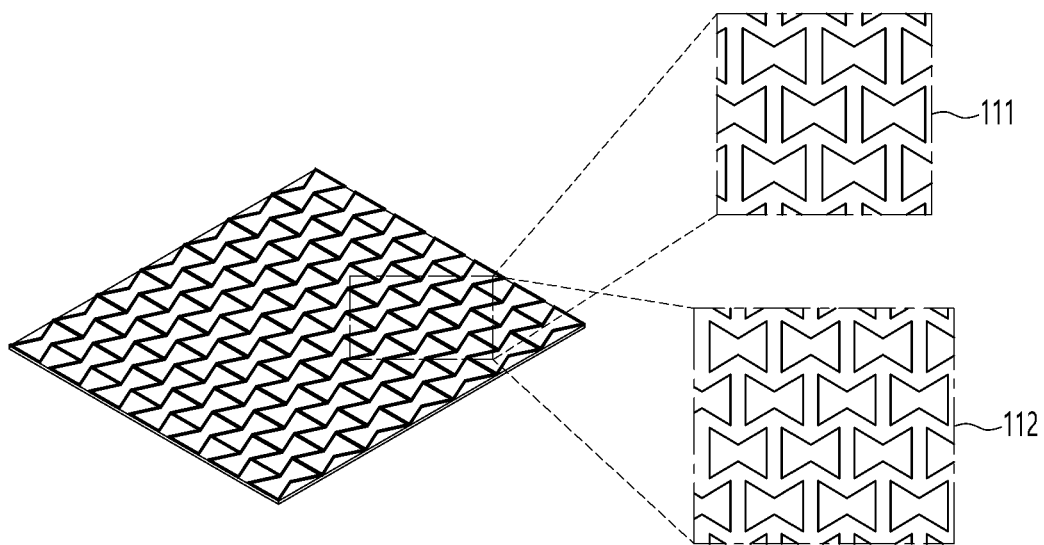
FIG. 6 is an exemplary diagram illustrating a method of controlling a strain according to the interval of an auxetic according to an embodiment of the present disclosure.

That is, the interval between the plurality of unit structures included in the auxetic 20 or the thickness of the plurality of unit structures may be associated with the control of a strain related to the other axis. For example, when the interval between the plurality of unit structures included in the auxetic 20 is short, the strain related to the other axis may be increased. Also, when the interval between the plurality of unit structures included in the auxetic 20 is long, the strain related to the other axis may be decreased. Referring to FIG. 6, reference numeral 111 may exemplify a case in which the interval between the plurality of unit structures is relatively short, and reference numeral 112 may exemplify a case in which the interval between the plurality of unit structures is relatively long.

That is, when the interval between the plurality of unit structures is relatively short, the number of unit structures per unit area may be relatively large. Thus, when an external force related to one axis direction is generated, the strain in the other axis may be increased. For example, when an external force is generated in the auxetic 20 in which the interval between the plurality of unit structures is relatively short with respect to the transverse axis (e.g., the x-axis), deformation (i.e., relatively large mechanical deformation) corresponding to the number of unit structures may be generated in the longitudinal direction (i.e., the y-axis), which is a direction vertical to the axis along which the external force is generated. On the contrary, when the interval between the plurality of unit structures is relatively long, the number of unit structures per unit area may be relatively small Thus, when a tensile force is generated in one axis, a strain in another axis may be decreased. Also, for example, when an external force is generated in the auxetic 20 in which the interval between the plurality of unit structures is relatively long with respect to the transverse axis (e.g., the x-axis), deformation (i.e., relatively small mechanical deformation) corresponding to the number of unit structures may be generated in the longitudinal direction (i.e., the y-axis), which is a direction vertical to the axis along which the external force is generated.

Figure 7A:
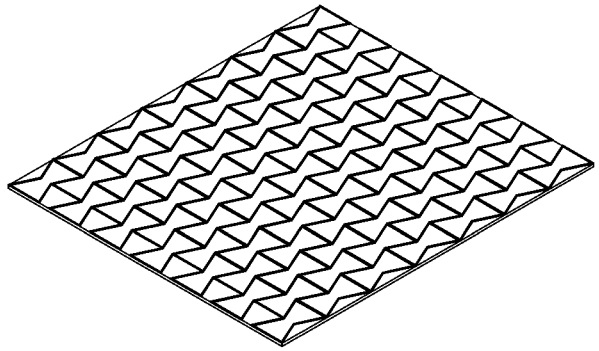
FIGS. 7A to 7C are exemplary diagrams illustrating a method of controlling a strain according to the thickness of an auxetic according to an embodiment of the present disclosure.
Figure 7B:
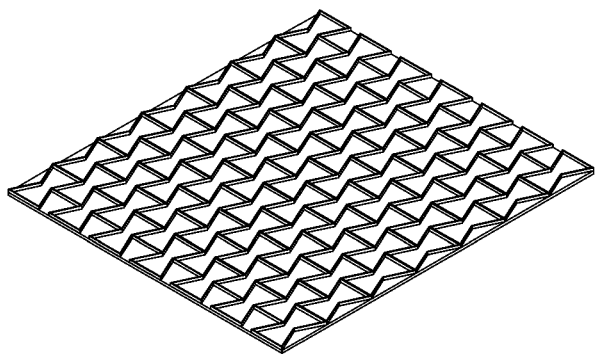
Figure 7C:
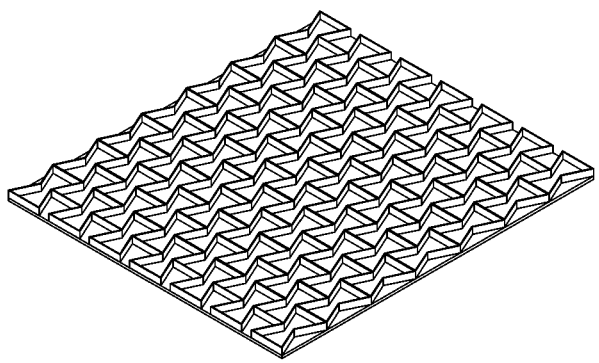

Also, when the thickness of the auxetic 20 is great, the strain related to the other axis may be increased. Also, when the thickness of the auxetic 20 is small, the strain related to the other axis may be decreased. FIGS. 7A, 7B, and 7C show auxetics with different thicknesses, and the auxetics may have a greater thickness in the order of FIGS. 7A, 7B, and 7C. That is, the auxetics may have a larger strain in the order of FIGS. 7A, 7B, and 7C.

In other words, according to the present disclosure, in response to an external force generated in one axis, it is possible to control the degree of deformation (i.e., a strain) generated in another axis by differently determining the interval between the plurality of unit structures or the thickness of the plurality of unit structures during the printing process for generating the auxetic 20.

For example, when the transparent stretchable substrate 100 including the auxetic 20 is used in the display field, the deformation in the other axis direction corresponding to the external force generated in the one axis may cause distortion of the transparent stretchable display. Accordingly, the transparent stretchable substrate 100 having a small strain in the other axis direction in response to an external force generated in the one axis may be required. In this case, according to the present disclosure, it is possible to control a strain generated in the other axis by determining that the interval between the plurality of unit structures is short or that the thickness of the plurality of unit structures is great during the processing process. That is, the transparent stretchable substrate 100 of the present disclosure may be generated through the interval between the plurality of unit structures or the thickness of the plurality of unit structures depending on the needs of a user, and thus may be a substrate capable of controlling a strain generated in the other axis.

In an additional embodiment, the transparent stretchable substrate 100 may include an auxetic 20 having one or more partitioned regions, unit structures with different intervals or thicknesses may be formed according to each of the partitioned regions. In this case, the one or more partitioned regions may be partitioned regions based on the arrangement of devices associated with the transparent stretchable substrate 100. For example, a region of the transparent stretchable substrate 100 in which many associated devices are expected to be arranged may have unit structures having a different interval or thickness from that of the other regions. That is, in a region expected to be most affected by a strain due to the intensive placement of devices, it is possible to secure connection stability to the devices by forming unit structures having a different interval or thickness from that of the other regions to control the strain. For example, in a region where devices are intensively placed, it is possible to minimize the strain by determining that the interval between the plurality of unit structures are short or that the thickness of the plurality of unit structures is large.

That is, the auxetic 20 may be generated on the upper side of the substrate part 10 by performing the printing process utilizing elastic materials. In other words, the auxetic 20 may be generated by using the substrate part 10 as a support to form (or stack) a plurality of unit structures having a specific shape on the upper side of the substrate part 10 through the printing process utilizing elastic materials. In this case, the interval or thickness of the plurality of unit structures constituting the auxetic 20 may be determined based on a strain related to the other axis direction, which is to be controlled, as described above.

According to an embodiment, the substrate part 10 and the auxetic 20 may contain the same elastic material. For example, the transparent stretchable substrate 100 of the present disclosure may be used in the display field. When the auxetic 20 and the substrate part 10 included in the transparent stretchable substrate 100 are made of different materials under the use conditions, a difference in refractive index between the auxetic 20 and the substrate part 10 occurs, and thus the resolution of a displayed screen may be insufficient. For example, when the substrate part 10 and the auxetic 20 are made of different materials, a difference in refractive index between the materials occurs, and thus there may be difficulties in securing visibility, and for example, an aspect of the auxetic impregnated in the substrate part 10 may be exposed.

Accordingly, the auxetic 20 and the substrate part 10 of the transparent stretchable substrate 100 of the present disclosure may contain the same material. For example, when the auxetic 20 contains a mechanical metamaterial of polydimethylsiloxane (PDMS), the substrate part 10 coupled to the auxetic 20 may contain the same PDMS material. That is, by minimizing the difference in refractive index between the auxetic 20 and the substrate part 10, transparency can be secured, and thus it is possible to provide a transparent stretchable substrate 100 with improved visibility in a display application field. Therefore, since the transparent stretchable substrate 100 of the present disclosure may be generated in consideration of the refractive indices of the materials, it is possible to provide improved transparency. Also, since the auxetic 20 and the substrate part 10 are made of the same material, adhesion can be improved upon the coupling or impregnation of the material, and thus it is possible to secure stability and durability. The above detailed description of the auxetic and the substrate part is only an example, and the present disclosure is not limited thereto.

Also, the operation of generating the auxetic 20 may include performing first curing and performing second curing. In this case, the operation of performing the second curing may proceed at a higher temperature than the operation of performing the first curing. In detail, when the printing process is performed on the upper side of the substrate part 10, the auxetic 20 including the plurality of unit structures may be formed (or stacked), and the first curing may be performed in response to the completion of the printing process for the corresponding auxetic 20. In this case, the first curing may refer to curing for coupling (or adhering) between the substrate part 10 and the auxetic 20. Also, the second curing may be performed on the substrate part 10 and the auxetic 20 that are coupled to each other through the first curing. In this case, the second curing may refer to curing for increasing the mechanical strength of the auxetic.

According to an embodiment of the present disclosure, the method of manufacturing the transparent stretchable substrate may include generating a fixing part on the substrate part 10 on which the auxetic is generated (S30). In this case, the fixing part 30 may be made of the same material as the substrate part 10. That is, the fixing part 30 may have the same ratio of the elastic material to a curing agent as the substrate part 10. Specifically, the generating of the fixing part may include supplying the fixing part 30 in a liquid state to the substrate part 10 coupled to the auxetic 20 and performing third curing. In detail, when the auxetic 20 is provided (or fixed) on the upper side of the substrate part 10, the transparent stretchable substrate 100 may be generated by supplying a fixing part of an elastic material in a liquid state to the substrate part 10 and the auxetic 20, bringing the fixing part into contact with the substrate part 10 and the auxetic 20, and then performing the third curing. In this case, the third curing may refer to curing for coupling (or adhering) between the auxetic 20 and the fixing part 30 and may refer to curing having the same curing conditions as the first curing. That is, the fixing part 30 may be formed on the upper side of the substrate part 10 and the auxetic 20 to fix the auxetic 20 and the substrate part 10 and form the top surface of the transparent stretchable substrate 100.

As described above, the first curing, the second curing, and the third curing may be performed while the transparent stretchable substrate 100 is being generated through the coupling of the auxetic 20, the substrate part 10, and the fixing part 30. In this case, the first curing and the third curing may have a different purpose from the second curing. For example, the first curing is curing for coupling between the auxetic 20 and the substrate part 10, and the third curing is curing for coupling between the auxetic 20 and the fixing part. The first curing and the third curing are for adhering between the materials, whereas the second curing may be curing for increasing the mechanical strength of the auxetic 20.

That is, since the purposes of curing are different, the curing times and curing temperatures may be different. Specifically, since the first curing and the third curing are for adhesion between the elastic materials in the liquid state, the first curing and the third curing may be performed at a relatively low temperature for a relatively short time so that complete solidification cannot be achieved. Also, the second curing may be performed at a relatively high temperature for a relatively long time because the second curing is for securing mechanical strength through the complete solidification of the elastic material in the liquid state. That is, the second curing may have a longer curing time and a higher curing temperature than the first curing. As a specific example, the first curing may be low-temperature curing at 80 degrees Celsius for 2.5 hours, and the second curing may be high-temperature curing at 165 degrees Celsius for 24 hours.

Additionally, the substrate part 10 and the auxetic 20 may contain the same elastic material. Also, the fixing part 30 may be made of the same elastic material as the substrate part 10. In detail, in order to secure transparency by minimizing the difference in refractive index, the substrate part 10 and the auxetic 20 may contain the same elastic material (e.g., PDMS) and may further contain a curing agent in different ratios. In this case, the substrate part 10 may have a first ratio of the curing agent to the elastic material, and the auxetic 20 may have a second ratio of the curing agent to the elastic material. In this case, the second ratio may be greater than the first ratio. As a specific example, the first ratio related to the substrate part 10 may be a ratio between PDMS and the curing agent being 20:1, and the second ratio related to the auxetic 20 may be a ratio between PDMS and the curing agent being 2:1. As described above, the difference between the curing ratio of the substrate part 10 and the curing ratio of the auxetic 20 may increase the mechanical strength of the auxetic 20, and thus it is possible to control a strain corresponding to the other axis.

In detail, when an external force is applied to the auxetic 20 with respect to the one axis, the strain related to the other axis may be controlled in response to the mechanical strength. Here, the mechanical strength may be determined based on the curing conditions of the auxetic 20. Specifically, the mechanical strength of the auxetic 20 may be determined differently depending on the curing conditions. For example, even if auxetics are made of the same material, the auxetics may have different mechanical strengths according to different curing rates, curing temperatures, and curing times.

Figure 8:
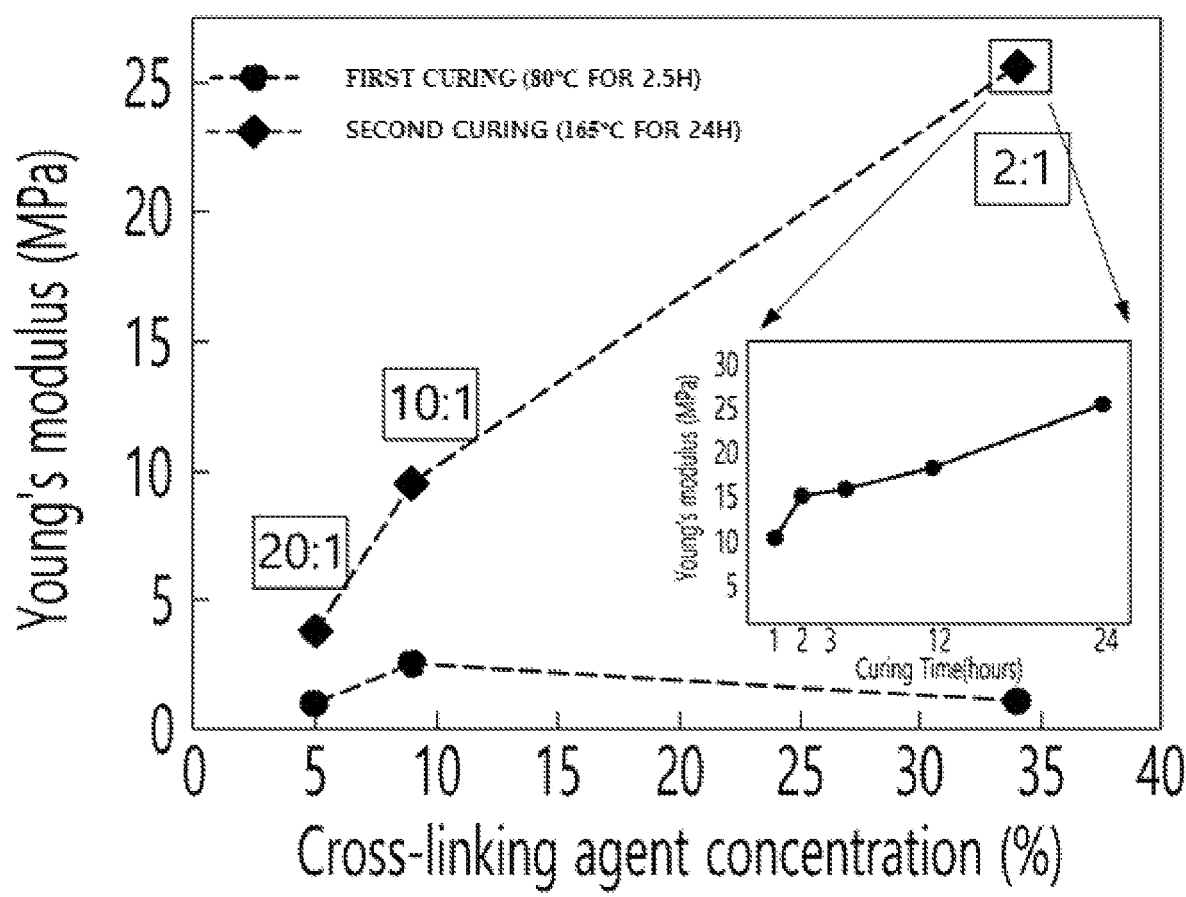
FIG. 8 is an exemplary graph showing a change in mechanical strength according to a curing condition according to an embodiment of the present disclosure.

As a specific example, referring to FIG. 8, it can be seen that the first curing at a relatively low temperature for a relatively short time (e.g., low-temperature curing at 80 degrees Celsius for 2.5 hours) does not have a large change (or difference) in modulus (i.e., mechanical strength) corresponding to each curing ratio. On the contrary, it can be seen that the second curing at a relatively high temperature for a relatively long time (e.g., high-temperature curing at 165 degrees Celsius for 24 hours) has a large change (or difference) in modulus corresponding to each curing ratio. That is, as shown in FIG. 8, the second curing shows a significant change in mechanical strength corresponding to the first ratio (i.e., the ratio between the elastic material and the curing agent being 20:1) and the second ratio (i.e., the ratio between the elastic material and the curing agent being 2:1). In other words, the second curing at a high temperature for a long time does not cause a significant change in the mechanical strength of the substrate part 10 formed at the first ratio but causes a significant change in the mechanical strength of the auxetic 20 formed at the second ratio. That is, the auxetic 20 included in the transparent stretchable substrate 100 of the present disclosure may have a high mechanical strength according to the above-described curing conditions, and the strain related to the other axis of the transparent stretchable substrate 100 may be controlled by the auxetic 20 with the relatively high mechanical strength. Thus, it is possible to reduce screen distortion.

In other words, when an external force based on a specific axis is generated, in order to control a strain related to another axis, the transparent stretchable substrate 100 of the present disclosure may include the auxetic 20 generated under curing conditions that allow mechanical strength corresponding to an appropriate strain. That is, as described above, the transparent stretchable substrate 100 may be formed by generating an auxetic 20 with the minimum strain in the other axis through different curing agent ratios of materials and one or more curing processes under different curing conditions. Accordingly, when an external force acts on the corresponding transparent stretchable substrate 100 with respect to a specific axis, a strain in another axis may be minimized, and thus it is possible to effectively reduce display distortion. Here, the other axis along which the strain is controlled by the mechanical strength may include a first axis located perpendicular to the one axis on the same plane and a second axis based on a plane perpendicular to the first axis and the corresponding same plane. As a specific example, when one axis is the x-axis, the other axis may include the y-axis (i.e., a first axis) and the z-axis (i.e., the second axis).

Accordingly, when the transparent stretchable substrate 100 of the present disclosure is utilized in the stretchable display field, it may be possible to control deformation corresponding to an axis affecting image quality (e.g., the y-axis). That is, it may be possible to provide a stretchable display with reduced distortion or improved image quality.

In an additional embodiment, the auxetic 20 may include one or more microstructures. Here, the one or more microstructures are for controlling a mechanical deformation distribution that occurs in response to an external force based on one axis, and may be formed to correspond to the shape of each of a plurality of unit structures. The one or more microstructures may be provided inside each of the plurality of unit structures constituting the auxetic. In general, when an auxetic structure is introduced, it is possible to control the strain in each axis corresponding to two dimensions, but a strain in the z-axis corresponding to three dimensions may be further accelerated. When an external force is applied to the x-axis or y-axis, a deformation (i.e., contraction) in the z-axis direction may cause distortion or image quality degradation in the stretchable display field. That is, the one or more microstructures may be for precisely controlling the strain in the z-axis direction on the surface related to the z-axis.

Specifically, the one or more microstructures may be made of an elastic (or stretchable) material and formed inside each of the plurality of unit structures. As a specific example, as shown in FIG. 4A, when the auxetic 20 includes unit structures having a reentrant shape, one microstructure may be provided in two triangular shapes for supporting the inside of the reentrant shape (e.g., a ribbon shape) of one unit structure. That is, one or more microstructures may be included in each of the plurality of unit structures, and when the sectional area of each of the plurality of unit structures is expanded due to an external force, the microstructures may supplement the corresponding sectional area, thereby minimizing a surface depression. Accordingly, upon stretching through an external force, it is possible to minimize distortion (e.g., wrinkles) in the z-axis surface due to contraction. The above detailed description of the shape of the microstructure is only an example, and the present disclosure is not limited thereto.

Thus, a mechanical metamaterial structure capable of controlling the Poisson's ratio can be introduced in a horizontal direction, and a microstructure can be introduced in a vertical direction to control a mechanical stress distribution. That is, it may be possible to provide a highly-reliable stretchable display by distributing a mechanical deformation toward a lower side of the substrate as much as possible.

According to various embodiments of the present disclosure, the present disclosure can provide a stretchable substrate that can be freely used by being deformed in multi-dimensional axis directions under various conditions. Also, the present disclosure can provide a stretchable substrate with high transmittance as well as a stable mechanical strain. In addition, when the substrate is stretched based on one axis, it is possible to reduce screen distortion by controlling a strain occurring in a direction vertical to the stretching direction.

Advantageous effects of the present disclosure are not limited to the aforementioned effects, and other effects not mentioned herein can be clearly understood by those skilled in the art from the following description.

Although embodiments of the present disclosure have been described with reference to the accompanying drawings, those skilled in the art will appreciate that various modifications and alterations may be made therein without departing from the technical spirit or essential feature of the present disclosure. Therefore, it should be understood that the above embodiments are illustrative rather than restrictive in all respects.

The particular implementations shown and described herein are illustrative examples of embodiments and are not intended to otherwise limit the scope of embodiments in any way. For the sake of brevity, conventional electronics, control systems, software, and other functional aspects of the systems may not be described in detail. Furthermore, the connecting lines, or connectors shown in the various presented drawings are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical."

It is to be understood that the specific order or hierarchy of the operations included in the presented processes is an example of exemplary approaches. Based upon design priorities, it is to be understood that the specific order or hierarchy of the operations in the processes may be rearranged within the scope of the present disclosure. The appended method claims provide elements of various operations in a sample order and are not meant to be limited to the specific order or hierarchy presented.

Description of the presented embodiments is provided to enable those skilled in the art to use or practice the present disclosure. Various modifications to these embodiments will be apparent to those skilled in the art, and general principles defined herein may be applied to other embodiments without departing from the scope of the present disclosure. Thus, the present disclosure is not to be limited to the embodiments presented herein and is to be interpreted in the broadest sense consistent with the principles and novel features presented herein.

What is claimed is:

1. A method of manufacturing a transparent stretchable substrate, the method comprising:
   generating a substrate part formed of an elastic material;
   generating an auxetic having a reentrant structure including a plurality of unit structures, on the substrate part; and
   generating a fixing part on the substrate part,
   wherein the substrate part, the auxetic, and the fixing part contain the same elastic material, and
   wherein
   the substrate part and the auxetic further contain a curing agent,
   a ratio of the curing agent to the elastic material in the substrate part is a first ratio,
   a ratio of the curing agent to the elastic material in the auxetic is a second ratio,
   a ratio of the curing agent to the elastic material in the fixing part is a third ratio,
   the second ratio is greater than the first ratio and the third ratio, and the first ratio is equal to the third ratio,
   the auxetic further includes a plurality of microstructures, each of which is positioned inside a respective unit structure of the plurality of unit structures, and
   all of the plurality of microstructures included in the auxetic have the same shape that is consisted of two triangular shapes, which supports an inside of a reentrant shape of the respective unit structure, and minimizes a mechanical deformation distribution generated in response to an external force with respect to one axis.

2. The method of claim 1, wherein in response to an external force generated with respect to one axis, each of the plurality of unit structures causes deformation of the auxetic with respect to an other axis, and
   wherein when the external force is applied to the auxetic with respect to the one axis, a strain related to the other axis is depending on the mechanical strength of the auxetic.

3. The method of claim 2, wherein the other axis comprises at least one of a first axis located perpendicular to the one axis on the same plane and a second axis based on a plane perpendicular to the same plane.

4. The method of claim 1, wherein the generating of the auxetic comprises performing a printing process utilizing an elastic material.

5. The method of claim 4, wherein
   the generating of the auxetic further comprises:
   performing first curing; and
   performing second curing; and
   the performing of the second curing proceeds at a higher temperature than the performing of the first curing.

6. The method of claim 5, wherein the generating of the fixing part comprises:
   supplying the fixing part in a liquid state to the substrate part coupled to the auxetic; and
   performing third curing, and
   the performing of the third curing proceeds at a lower temperature than the performing of the second curing.

7. The method of claim 1, wherein the auxetic has a higher strength than those of the substrate part and the fixing part.

8. The method of claim 1, wherein the auxetic has a plurality of partitioned regions, and each of the partitioned regions has different intervals or thicknesses of auxetic structures.

* * * * *